United States Patent [19]
Crotti

[11] Patent Number: 5,332,470
[45] Date of Patent: Jul. 26, 1994

[54] PROCESS FOR MANUFACTURING CALIBRATION STRUCTURES PARTICULARLY FOR THE CALIBRATION OF MACHINES FOR MEASURING ALIGNMENT IN INTEGRATED CIRCUITS IN GENERAL

[75] Inventor: Pier L. Crotti, Landriano, Italy

[73] Assignee: SGS-Thomson Microelectronics S.r.l., Agrate Brianza, Italy

[21] Appl. No.: 149,707

[22] Filed: Nov. 9, 1993

Related U.S. Application Data

[63] Continuation of Ser. No. 896,822, Jun. 11, 1992, abandoned.

[30] Foreign Application Priority Data

Jun. 24, 1991 [IT] Italy ............... MI91A001727

[51] Int. Cl.⁵ ............... H01L 21/306; B44C 1/22; C03C 15/00; C03C 25/06
[52] U.S. Cl. ............... 156/659.1; 156/626; 156/653; 156/657; 156/662; 437/228; 437/233; 437/8; 437/41
[58] Field of Search ............... 156/626, 644, 653, 656, 156/657, 659.1, 661.1, 662; 437/8, 41, 228, 238, 241, 245, 233

[56] References Cited

U.S. PATENT DOCUMENTS

| | | | |
|---|---|---|---|
| 4,307,179 | 12/1981 | Chang et al. | 430/314 |
| 4,576,900 | 3/1986 | Chiang | 430/313 |
| 4,767,660 | 8/1988 | Hosoda et al. | 156/667 |
| 4,888,450 | 12/1989 | Lando et al. | 174/68.5 |
| 5,055,383 | 10/1991 | Koblinger et al. | 430/312 |
| 5,246,539 | 9/1993 | Candestrari | 156/659.1 |

FOREIGN PATENT DOCUMENTS

0369053 11/1988 European Pat. Off. .

*Primary Examiner*—William Powell
*Attorney, Agent, or Firm*—Wolf, Greenfield & Sacks

[57] ABSTRACT

Process for the manufacture of calibration structures particularly for the calibration of machines for measuring alignment in integrated circuits in general, the peculiarity of which consists in the fact that calibration structures are provided in which the alignment of one layer with respect to another layer is set to a known extent by means of a single masking.

18 Claims, 6 Drawing Sheets

PROCESS FOR MANUFACTURING CALIBRATION STRUCTURES PARTICULARLY FOR THE CALIBRATION OF MACHINES FOR MEASURING ALIGNMENT IN INTEGRATED CIRCUITS IN GENERAL

This application is a continuation of application Ser. No. 07/896,822, filed Jun. 11, 1992, now abandoned.

BACKGROUND OF THE INVENTION

The present invention relates to a process for manufacturing calibration structures particularly for the calibration of machines for measuring alignment in integrated circuits in general.

In the manufacture of integrated circuits by means of photolithographic processes and the like, a technical problem which occurs with increasing frequency is related to the calibration of the measurement machines which are intended to measure the alignment of the different layers of the integrated circuit, i.e., to check the possible misalignment of successive masks on a same substrate made, for example, of silicon, gallium arsenide and the like.

The precision required of these measurement machines are increasingly high; this fact is related to the increasingly higher density and circuit complexity of the various integrated circuits. Indeed, for example, for erasable and programmable read-only memories, technically known as EPROMs, having a complexity equal to 1 megabit, the alignment tolerances must be smaller than 0.40 micrometers; for a complexity equal to 4 megabits, the alignment tolerances must be smaller than 0.25 micrometers; for EPROMs having a complexity equal to 64 megabits, the alignment tolerances must be smaller than 0.10 micrometers with measurement accuracies of less than 15-20 nanometers, i.e., equal at most to one-fifth of the maximum alignment tolerance.

In order to achieve the above mentioned alignment levels, it is indispensable to provide systems for the calibration of the measurement machines which are accurate and precise to be able to check the operation of photolithographic machines, known as wafer steppers, such calibrated measurement machines indicate any corrections to be performed in order to eliminate errors, such as magnification factors of the lens systems, alignment offsets, combined rotations and translations and the like, as well as the errors in the product, i.e., the silicon substrates or wafers, after the various masking steps.

For some particular applications, it is already possible to have calibration patterns on a single mask with a known misalignment, by means of which it is possible to calibrate the measurement machines. The limitation of these methods is due to the fact that all calibration or reference patterns are currently etched in the same layer, whereas it is indispensable, in manufacturing practice, to evaluate the misalignment among different layers.

SUMMARY OF THE INVENTION

The aim of the present invention is to eliminate or substantially reduce the disadvantages described above by providing a process for manufacturing calibration structures particularly for the calibration of machines for measuring alignment in integrated circuits in general, which allows the calibration of alignment measuring machines by the use of calibration or reference structures defined among different layers of the integrated circuit as a calibration base.

Within the scope of this aim, an object of the present invention is to provide a process which allows a relatively simple calibration of calibration machines.

Not the least object of the present invention is to provide a process which is relatively easy to execute, at competitive costs and with already-known methods.

This aim, the objects mentioned and others which will become apparent hereinafter are achieved by a process for manufacturing calibration structures particularly for the calibration of machines for measuring alignment and thus check the possible misalignment in integrated circuits in general according to the invention, as defined in the accompanying claims.

BRIEF DESCRIPTION OF THE DRAWINGS

Further characteristics and advantages of the invention will become apparent from the description of some preferred but not exclusive embodiments of a process for manufacturing calibration structures particularly for the calibration of machines for measuring alignment in integrated circuits in general according to the invention, illustrated only by way of non-limitative example in the accompanying drawings, wherein:

FIGS. 5a to 5h are sectional views of a calibration structure, exemplifying successive steps of a further way of carrying out the process according to the invention for obtaining the calibration structure of FIG. 2a.

DESCRIPTION OF THE PREFERRED EMBODIMENTS

Hereinafter, the term "to mask" or "masking" is used to indicate the well-known photolithographic processes by means of which the radiation-sensitive material is made soluble or insoluble by exposure to a source of radiation which is controlled and filtered by a mask which bears the layout of the individual layer. In most practical cases, the radiation-sensitive material is constituted by light-sensitive resin, technically known as photoresist, this term being used hereinafter, whereas the radiation source is usually a source of electromagnetic radiation, usually in the visible or ultraviolet range. The term "etching" is used to indicate the chemical or chemical-physical engraving, performed, for example, with plasma, of the layers of the calibration structure, and the terms "doping" or "to dope" indicate the insertion, either by gaseous diffusion or by high-energy implantation, of impurities within at least one layer.

Figure 1A:
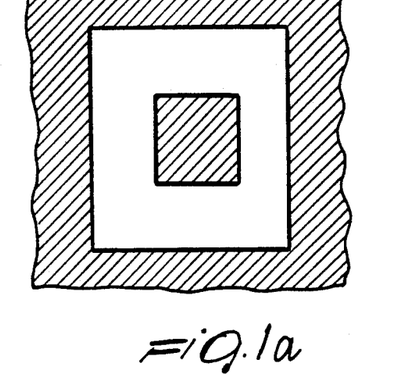
FIGS. 1a, 1b, 1c and 1d are plan views and sectional views of calibration patterns which have limited applications and are obtained by using known manufacturing processes.
Figure 1B:
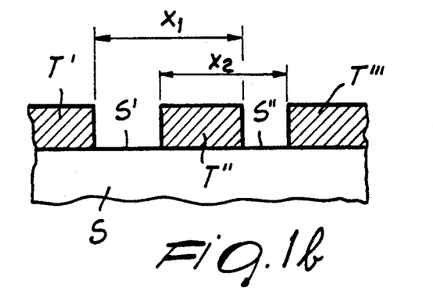

With reference to FIGS. 1a and 1b, a layer T is deposited or grown on a substrate S which is subsequently masked, exposed to the electromagnetic radiation source and then developed, in a well-known manner, with the mask illustrated in FIG. 1a. An etching is then performed which eliminates portions of the layer T, leaving portions T', T" and T'" thereof on the substrate S and uncovering small areas S' and S" of the substrate. The degree of misalignment d is measured here, with reference to the dimensions provided in FIG. 1b, by calculating the half-difference between the parameters $x_1$ and $x_2$, i.e.:

$$d=(x_1-x_2)/2$$

Figure 1C:
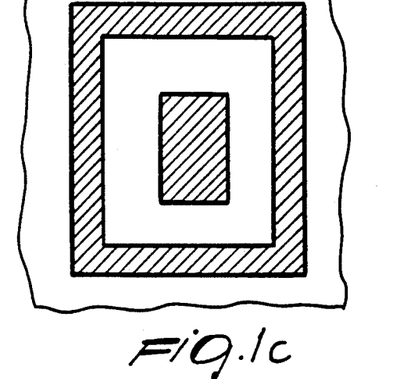
Figure 1D:
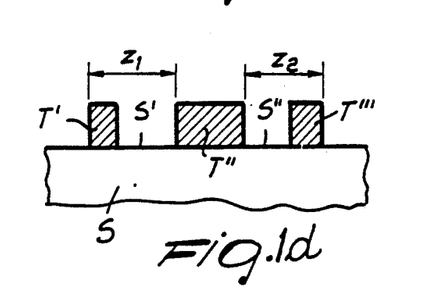

With reference to FIGS. 1c and 1d, and performing the same operations described above for FIGS. 1a and 1b, and with reference to the dimensions of FIG. 1d, the amount d is measured by calculating the half-difference between the parameters $z_1$ and $z_2$, i.e.:

$$d=(z_1-z_2)/2$$

Thus, the calibration of the measurement machines is performed on a single layer T deposited or grown on a substrate S, and this fact has a limiting effect in the manufacture of integrated circuits. Known calibration patterns are exemplified in commercial documents, for example, those of KLA Instruments Corporation related to a product named the KLA 5000 and dated Aug. 10, 1990, and those of VLSI Standards Inc., entitled "Overlay Standard Application Note", which is related to calibration patterns for measurement machines.

Figure 2A:
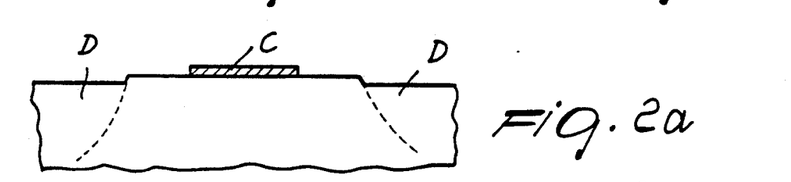
FIGS. 2a, 2b and 2c are sectional views of calibration structures obtained by means of the process according to the invention, which resemble real situations.
Figure 2B:
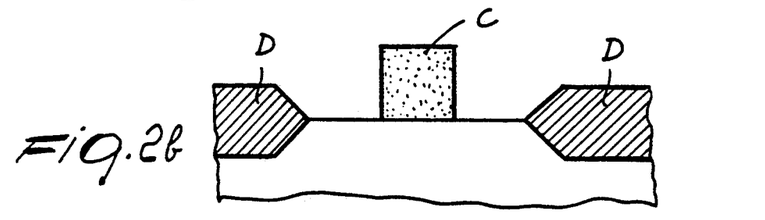
Figure 2C:
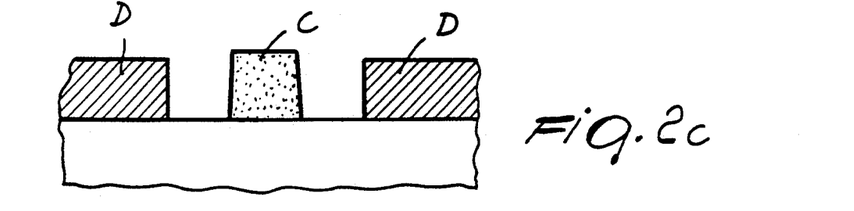

FIGS. 2a, 2b and 2c illustrate real cases which can occur in the manufacture of integrated circuits. In these Figs., C and D indicate the different layers which are aligned, or misaligned by an amount known beforehand, with the process according to the invention. By way of non-limitative example, FIG. 2a illustrates a calibration structure which has active area regions C which are masked with silicon nitride with respect to N-doped wells D; FIG. 2b illustrates a polysilicon mask C with respect to field oxide regions D; and FIG. 2c illustrates a general case, wherein the layer C can be constituted by polysilicon, or by dielectric for contacts, or by a first metallization, or by vias, whereas the layer D can be constituted respectively by a layer of contacts, or by a metallized layer, or by vias or, finally, by a second metallized layer. The layers C and D can naturally be manufactured by reversing the materials used for their formation, besides the possible combinations described above. The combinations depend exclusively on the type of calibration structure being manufactured.

Figure 3A:
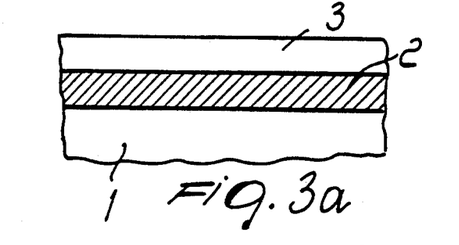
FIGS. 3a to 3i, 3f',3g',3e" and 3f' are sectional views of a calibration structure, exemplifying successive steps of a way of carrying out the process according to the invention for obtaining the calibration structure of FIG. 2c.
Figure 3B:
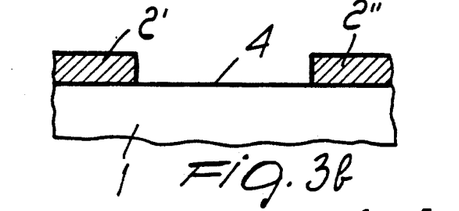

With reference to FIGS. 3a to 3e, a process for the manufacture of calibration structures particularly for the calibration of machines for measuring alignment in integrated circuits in general comprises the following steps, performed on a substrate such as, for example, a wafer of silicon or gallium arsenide or other material:
  a preparation step, FIG. 3a, whereat a first layer 2 of a first material is grown or deposited on a silicon substrate 1 and a first layer 3 of photoresist is deposited thereon;
  a first masking step, FIG. 3b, whereat the first photoresist 3 is masked in a conventional manner and a soluble part thereof is removed. Then the first layer 2 is etched, uncovering a portion 4 of the substrate 1, and the remaining first photoresist 3 is removed, leaving separate portions 2' and 2" of the first layer 2;
  a first deposition step, FIG. 3c, whereat a second layer 5 of a second material is deposited on the portions 2' and 2" of the first layer 2 and on the portion 4 of the substrate 1; a second layer of photoresist 6 is then deposited on the second layer;
  a second masking step, FIG. 3d, whereat the second layer of photoresist 6 is masked, a soluble part thereof is removed, leaving portions 6', 6" and 6'" thereof above the second layer 5 at the portion 4 and at the portions 2' and 2" of the first layer 2, uncovering portions 5a and 5b of the second layer 5;
  a first etching step, FIG. 3e, whereat the uncovered portions 5a and 5b of the second layer 5 are etched. The portions 6', 6" and 6'" of the second photoresist 6 are then removed. This first etching leaves uncovered portions 5', 5" and 5'" of the second layer as well as portions 2a and 2b of the first layer 2.

From this point onward, the process according to the invention can follow two mutually exclusive paths. The first provides the following steps:
  a second etching step, FIG. 3f, whereat the uncovered portions 2a and 2b of the first layer 2 are etched. This etching self-aligns the portions 2' and 2" of the first layer 2 with the overlaying portions 5' and 5'" of the second layer 5;
  a third masking step, FIG. 3g, whereat a third layer of photoresist is deposited; then the layer is masked and the soluble portions thereof are removed, leaving a portion 7 thereof to protect the portion 5" of the second layer 5;
  a third etching step, FIG. 3h, whereat the portions 5' and 5'" of the second layer 5 remaining on the portions 2' and 2" of the first layer 2 are removed;
  a final step, FIG. 3i, whereat the portion 7 of photoresist is removed, obtaining portions 2' and 2" of the first layer 2 and the portion 5" of the second layer 5, which are mutually aligned or misaligned by an amount which is set by means of the masking performed during the first masking step.

Figure 3C:
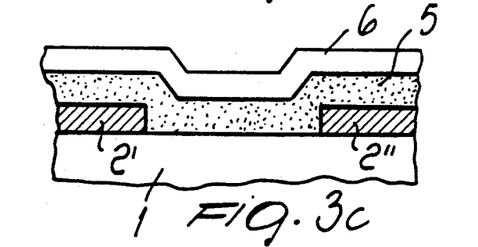
Figure 3D:
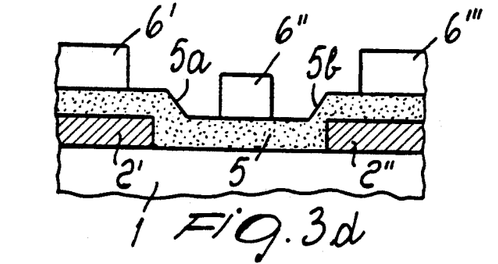
Figure 3E:
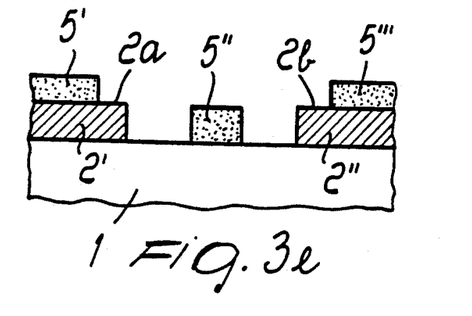
Figure 3F:
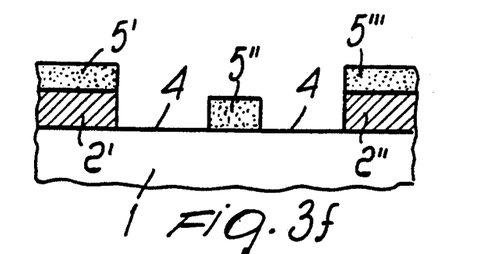
Figure 3G:
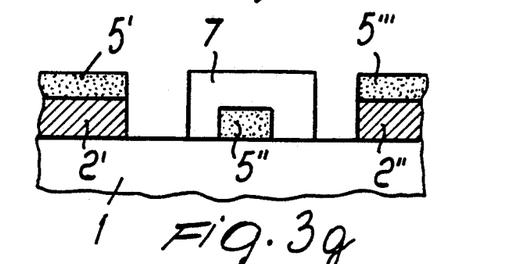
Figure 3H:
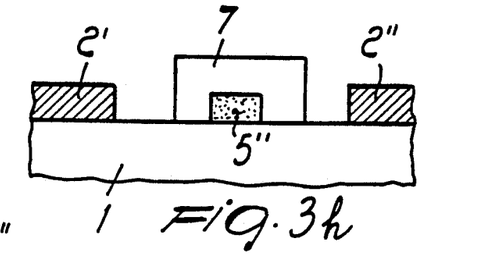
Figure 3I:
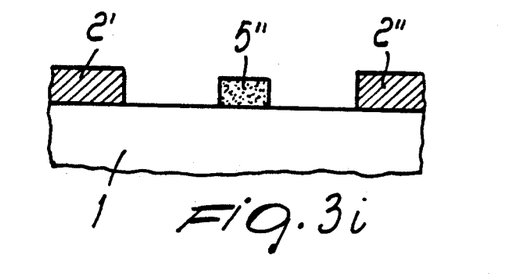

The second path provides the following steps:
  a third masking step, FIG. 3g', whereat a third layer of photoresist is deposited and then masked; the soluble portions thereof are removed, leaving a portion 7 of photoresist to protect the portion 5" of the second layer 5;
  a second etching step, FIG. 3f', whereat the uncovered portions 2a and 2b of the first layer 2 are etched, causing the self-alignment of the portions 2' and 2" of the first layer 2 with the overlaying portions 5' and 5'" of the second layer 5;
  a third etching step, FIG. 3h, whereat the portions 5' and 5'" of the second layer 5 which had remained on the portions 2' and 2" of the first layer 2 are removed;
  a final step, FIG. 3i, whereat the portion 7 of photoresist is removed, obtaining portions 2' and 2" of the first layer 2 and the portion 5" of the second layer 5, which are mutually aligned or misaligned by an amount which is set by means of the masking performed during the first masking step.

A variation of the previously described process is as follows:

a preparation step, FIG. 3a, whereat a first layer 2 of a first material is grown or deposited on a silicon substrate 1 and a first photoresist layer 3 is then deposited thereon;

a first masking step, FIG. 3b, whereat the first photoresist 3 is masked in a conventional manner and the soluble part thereof is removed. Then the first layer 2 is etched, uncovering a portion 4 of the substrate 1, and the remaining first photoresist 3 is removed, leaving separate portions 2' and 2" of the first layer 2;

a first deposition step, FIG. 3c, whereat a second layer 5 of a second material is deposited on the portions 2' and 2" of the first layer 2 and on the portion 4 of the substrate 1, and a second layer of photoresist 6 is then deposited on said second layer 5;

a second masking step, FIG. 3d, whereat the second layer of photoresist 6 is masked, a soluble part thereof is removed, leaving portions 6', 6" and 6''' thereof above the second layer 5 at the portion 4 and at the portions 2' and 2" of the first layer 2, and uncovering portions 5a and 5b of the second layer 5;

a first etching step, FIG. 3e'', whereat the uncovered portions 5a and 5b of the second layer 5 are etched. This first etching leaves portions 2a and 2b of the first layer 2 uncovered;

a second etching step, FIG. 3f', whereat the uncovered portions 2a and 2b of the first layer 2 are etched, entailing the self-alignment of the portions 2' and 2" of the first layer 2 with the overlaying portions 5' and 5''' of the second layer 5 and with the portions 6' and 6''' of the second photoresist 6. The portions 6', 6" and 6''' of the second photoresist 6 are then removed;

a third masking step, FIG. 3g, whereat a third photoresist layer is deposited; then the layer is masked and the soluble portions thereof are removed, leaving a portion 7 thereof to protect the portion 5" of the second layer 5;

a third etching step, FIG. 3h, whereat the third portions 5' and 5''' of the second layer 5 remaining on the portions 2' and 2" of the first layer 2 are removed;

a final step, FIG. 3i, whereat the portion 7 of the third photoresist is removed, obtaining portions 2' and 2" of the first layer 2 and the portion 5" of the second layer 5, which are mutually aligned or misaligned by an amount which is set by means of the masking performed during the first masking step.

Calibration structures of the type illustrated in FIG. 2c are obtained with the different executions of the process according to the invention described above.

In the above described executions it is possible, if the selectivity of the etchings is not sufficient, to deposit, similarly to what is done in some integrated circuit manufacturing processes, layers which are technically termed sacrificial layers for protecting a particular layer.

The dimensions of the various patterns, in the masks used in the second masking steps, are between approximately 10 and 30 micrometers, without therefore being critical either for resolution or for alignment.

If the first layer 2 of the above described process is constituted by thermally grown silicon oxide, there are technical problems which consist of the fact that:

photoresist does not withstand the high temperatures of the furnaces used to perform the process;

it is necessary to deposit silicon nitride layers in order to prevent the growth of thermal silicon oxide.

Figure 4A:
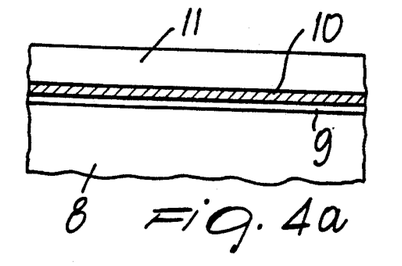
FIGS. 4a to 4i are sectional views of a calibration structure, exemplifying successive steps of another way of carrying out the process according to the invention for obtaining the calibration structure of FIG. 2b.
Figure 4B:
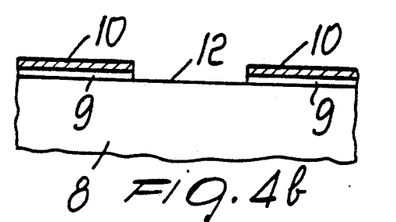
Figure 4C:
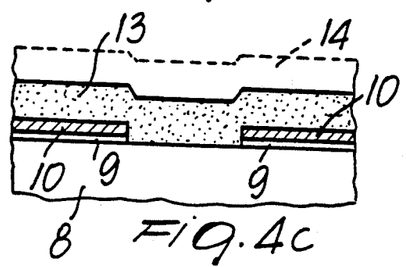
Figure 4D:
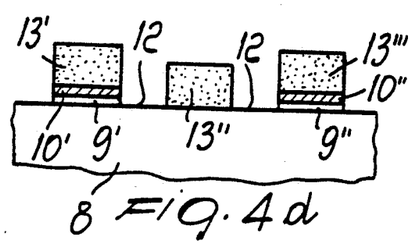
Figure 4E:
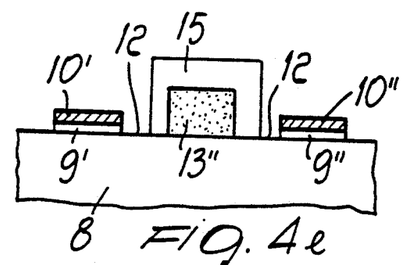
Figure 4F:
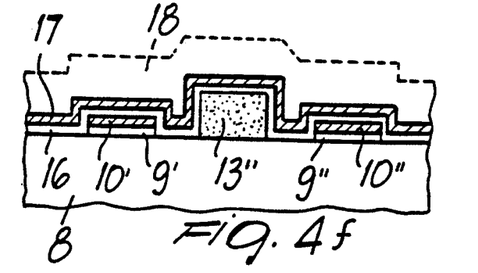
Figure 4G:
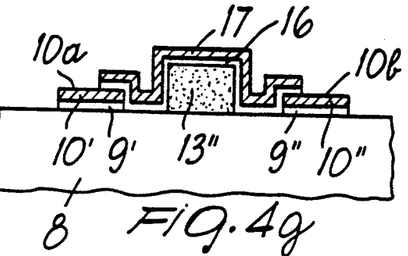
Figure 4H:
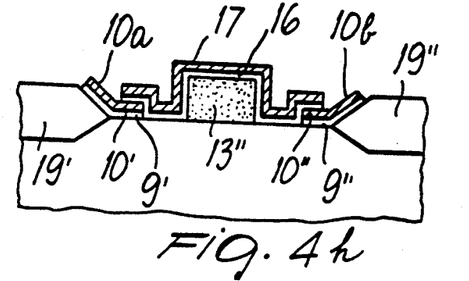
Figure 4I:
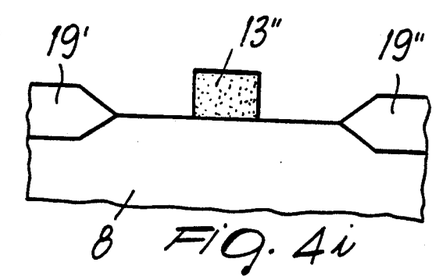

In order to obviate the described technological problems, another way of carrying out the process according to the invention provides the following steps, with reference to FIGS. 4a to 4i, which are performed on a substrate, such as, for example, a wafer made of silicon, gallium arsenide or other material:

a preparation step, FIG. 4a, whereat a first layer 9 of silicon oxide, technically known as pad oxide, is grown and a second layer 10 of silicon nitride is deposited on a silicon substrate 8;

a first masking step, FIGS. 4a and 4b, whereat a first layer 11 of photoresist is deposited on the second layer 10, is then masked, and the soluble portions thereof are removed. Then the second layer 10 and the first layer 9 are etched so as to uncover a portion 12 of silicon substrate 8;

a first deposition step, FIG. 4c, whereat a third layer 13 of polysilicon is deposited on the entire calibration structure;

a second masking step, FIGS. 4c and 4d, whereat a second layer 14 of photoresist is deposited on the third layer 13 and is masked; the soluble portions thereof are removed, uncovering portions of the third layer 13;

a first etching step, FIG. 4d, whereat the uncovered portions of the third layer 13 are etched and removed, uncovering portions of the second layer 10, which are then etched and removed, together with underlying portions of the first layer 9. The remaining photoresist is then removed, and protective regions composed of portions 13' and 13''' of the third layer 13, superimposed on portions 10' and 10" of lo the second layer, superimposed on portions 9' and 9" of the first layer 9, and protective regions individually composed of the portion 13" of the third layer, remain on the substrate 8;

a third masking step, FIG. 4e, whereat a third layer 15 of photoresist is deposited and is then masked, soluble portions thereof are then removed, whereas an insoluble portion, indicated by the same reference numeral 15, covers the protective region 13" of the third layer 13. Then the portions 13' and 13''' of the third layer 13 are etched, uncovering the portions 10' and 10" of the second layer 10, and the third photoresist portion 15 is finally removed;

a second deposition step, FIG. 4f, whereat a fourth layer 16 of silicon oxide is deposited and a fifth layer 17 of silicon nitride is deposited thereon;

a fourth masking step, FIGS. 4f and 4g, whereat a fourth layer 18 of photoresist is deposited on the fifth layer 17 and is then masked, subsequently removing the soluble portions thereof, simultaneously uncovering portions of the fifth layer 17. An etching is then performed, removing the portions of the fifth layer 17 and of the underlying fourth layer 16, uncovering portions 10a and 10b of the second layer 10. The remaining of the fourth photoresist 18 is then removed;

a growth step, FIG. 4h, whereat further protective regions 19' and 19" of thermal silicon oxide are grown outside the portions 10a and 10b of the third layer 10. The further protective regions 19' and 19" extend partially below the portions 10a and 10b due to the known "planox beak" growth effect;

a final etching step, whereat the fifth layer 17, the fourth layer 16, the portions 10' and 10" of the second layer 10 and the portions 9' and 9" of the first layer 9 are removed, leaving the portion 13" of the third layer 13 between the further protective regions 19' and 19" of thermal silicon oxide. The portion 13" of the third layer 13 is aligned or misaligned by a known amount with respect to the further protective regions 19' and 19" of thermal silicon oxide.

The calibration structures illustrated in FIG. 2b are obtained with the above described way of carrying out the process.

Figures 5A, 5B, 5E, 5F:
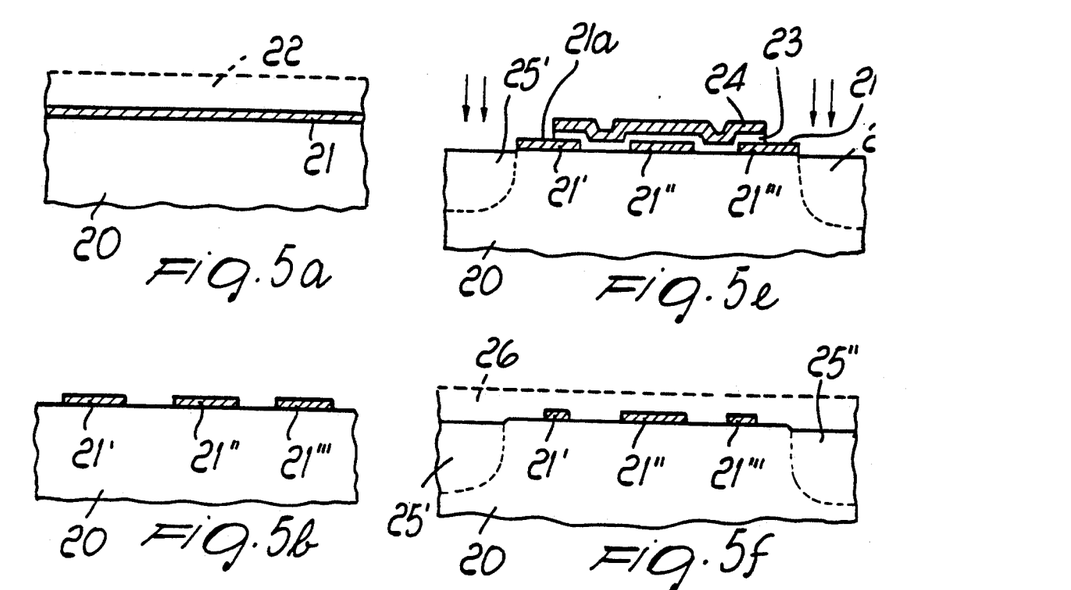
Figure 5C:
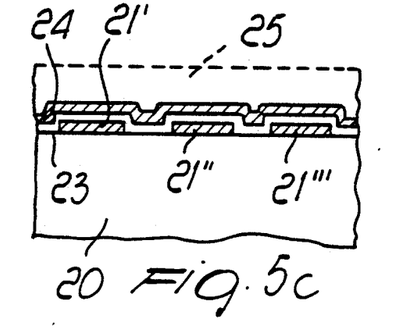
Figure 5D:
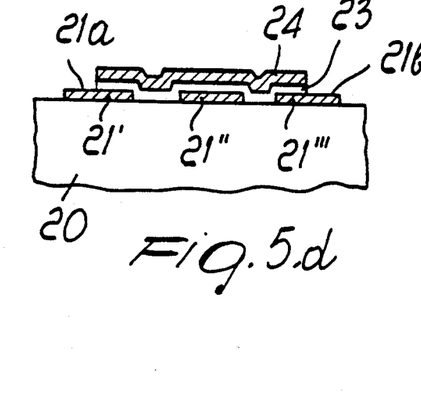
Figure 5G:
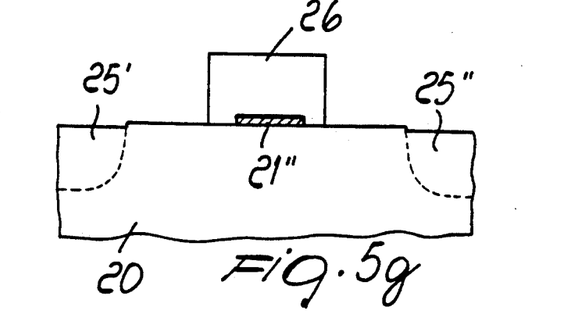
Figure 5H:
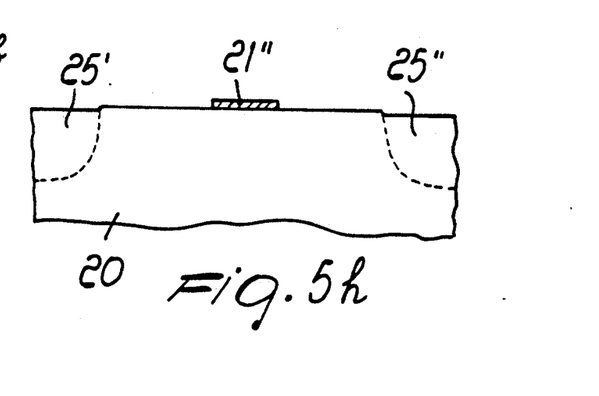

A further implementation of the process according to the invention comprises the following steps, which are performed on a substrate, such as, for example, a wafer of silicon or gallium arsenide or other material:

a preparation step, FIG. 5a, whereat a first layer 21 of silicon nitride is deposited on a silicon substrate 20;

a first masking step, FIGS. 5a and 5b, whereat a first layer 22 of photoresist is deposited on the first layer 21 and is then masked; the soluble portions thereof are removed to define photoresist regions 22 overlaying the first layer 21 and then etching and removing portions of the first layer 21 which have been left uncovered by the removal of the soluble portions of the first photoresist 22. The defined photoresist regions 22 are then removed, uncovering the separated regions 21', 21" and 21''' of the first layer 21;

a deposition step, FIG. 5c, whereat a second layer 23 of silicon oxide is deposited on the separated regions 21', 21" and 21''' of the first layer 21 and on the substrate 20, and a third layer 24 of silicon nitride is then deposited on said second layer 23;

a second masking step, FIGS. 5c and 5d, whereat a second layer 25 of photoresist is deposited on the third layer 24 and is then masked, subsequently removing the soluble portions thereof and uncovering portions of the third layer 24. The third layer 24 and the second layer 23 are then etched, uncovering lateral portions 21a and 21b of the separated regions 21' and 21" of the first layer 21;

a doping step, FIG. 5e, whereat a doping with impurities A is performed and is possibly followed by a diffusion in order to define doped wells 25' and 25" at the sides of the separated regions 21' and 21''' of the first layer 21. Possible oxidations and etchings are then performed. For example, in order to simulate real processes for the manufacture of EPROM memories, the doped wells 25' and 25" are oxidized and slightly etched, lowering their "level";

a first etching step, FIG. 5f, whereat the third layer 24 and the portions 21a and 21b of the first layer 21 are removed and then the second layer 23 is removed, leaving uncovered the separated regions 21', 21" and 21''' of the first layer 21 between the doped wells 25' and 25";

a third masking step, FIGS. 5f and 5g, whereat a third layer of photoresist 26 is deposited on the separated regions 21', 21" and 21''' of the first layer 21 and on the substrate 20 and is subsequently masked; soluble portions of said photoresist layer 26 are removed, leaving as protection thereof, a portion of the photoresist indicated by the same reference numeral 26, over the separated region 21" and leaving uncovered the separated regions 21' and 21''';

a second etching step, FIG. 5g, whereat the separated regions 21' and 21''' of the first layer 21 are etched and removed;

a final step, whereat the portion 26 of photoresist is removed, uncovering the separated region 21". The separated region 21" is either aligned or misaligned by a known amount, which is set during the first masking step, with respect to the doped wells 25' and 25".

The above implementation can have a silicon oxide layer interposed between the substrate 20 and the first silicon nitride layer 21. This implementation can be used to obtain calibration structures of the type illustrated in FIG. 2a.

The impurities A in the wells 25' and 25" can be negative impurities or positive impurities; this fact depends on the type of calibration structure being manufactured.

Seen in plan view, the calibration structures can have the same configuration as the calibration patterns illustrated in FIGS. 1a and 1c, or can have other geometrical shapes, such as L-shaped ones, or yet other The silicon or gallium arsenide wafer is the base on which the complex calibration structures are simultaneously manufactured. The preset area on the wafer on which the above described process is applied can be selected appropriately according to the available type of alignment measuring machine.

Figure 6:
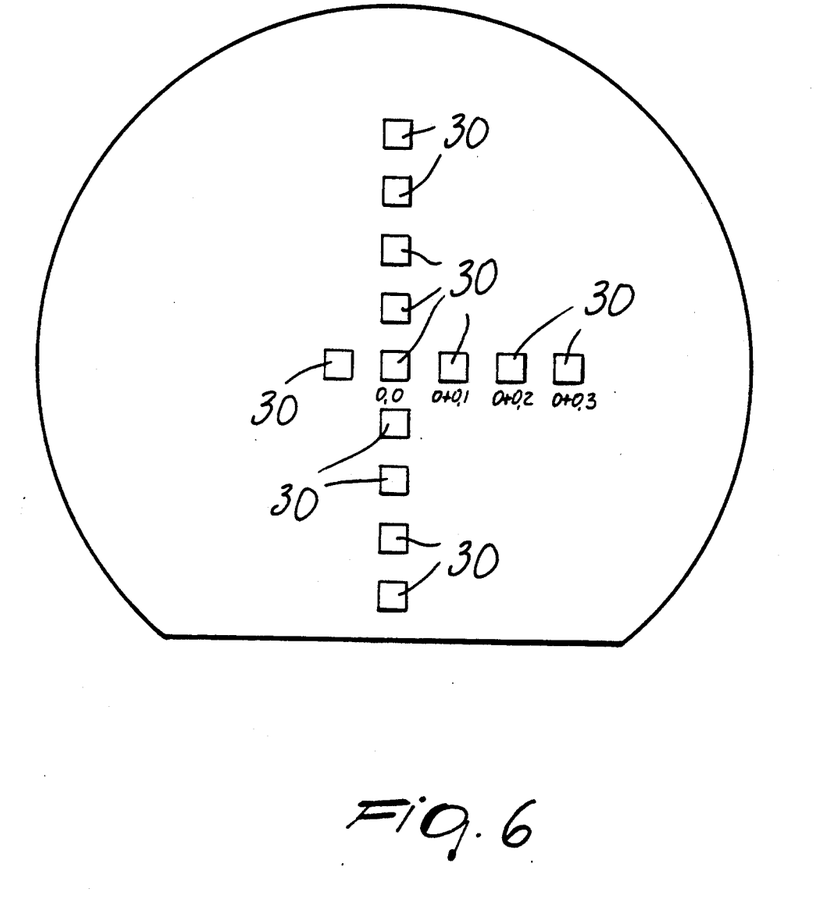
FIG. 6 is a plan view of an area of a substrate having a plurality of calibration structures with various x and y misalignments arranged in preset positions, as an example of a possible calibration instrument.

In particular it is possible to manufacture calibration wafers, such as the one illustrated in FIG. 6, which has a plurality of calibration areas 30, each of which has a plurality of cells or calibration structures of one of the described types, associated in groups which have a finite number of calibration structures. Each area 30 can be identified with the respective misalignment set during the execution step, which is measured, for example, in micrometers or in another appropriate unit of measurement with respect to a reference group with no misalignment. By means of this type of calibration wafer, it is possible to calibrate the measurement machines.

It has thus been observed that the invention achieves the intended aim and objects, constituting a process for manufacturing calibration structures particularly for the calibration of machines for measuring alignment in integrated circuits in general which allows the imposition of a misalignment of known extent to a part of a calibration structure with respect to the other component parts. Conveniently, these ways of carrying out the process according to the invention can be applied to any integrated circuit, with the appropriate modifications dictated by the different manufacturing technologies employed, such as MOS, NMOS, PMOS, bipolar and the like.

Advantageously, since the possible misalignment between the layers is known, the item obtained by carrying out the process according to the invention is an instrument, such as a calibration wafer, for the relative easy calibration of known measurement machines, without any structural modification thereof.

Conveniently, the masks used for the implementation of the preferred but not exclusive embodiments of the process according to the invention can be used to manufacture calibration structures as described above, thus obtaining calibration wafers for calibrations as mentioned above.

The invention thus conceived is susceptible to numerous modifications and variations, all of which are within the scope of the inventive concept. All the details may furthermore be replaced with other technically equivalent elements.

In practice, the materials employed, as well as the dimensions, may be any according to the requirements.

I claim:

1. A process for manufacturing a calibration structure, particularly for the calibration of machines for measuring the degree of misalignment in integrated circuits in general, said process comprising the following steps, performed on at least one calibration structure arranged in a preset position on a substrate:

a preparation step, whereat a first layer of a first material is selectively grown and deposited on a substrate and a first layer of radiation-sensitive material is deposited thereon;

a first masking step, whereat said radiation-sensitive material is masked, a soluble part thereof is removed, said first layer is etched, uncovering a portion said substrate, and the remainder of said radiation-sensitive material is removed;

a first deposition step, during which a second layer of a second material is deposited on said first layer and on said portion of said substrate, a second layer of radiation-sensitive material being then deposited on said second layer;

a second masking step, whereat said second radiation sensitive material layer is masked and a soluble part thereof is removed, leaving portions thereof above said second layer at said portion of said substrate and at said first layer; and a first etching step, whereat said second layer is etched at uncovered portions thereof and said portions of said second radiation-sensitive material are eliminated, said first etching leaving uncovered portions of said first layer and the overlaying portions of said second layer and a further portion of said second layer at said substrate.

2. The process according to claim 1, further comprising the following steps:

a second etching step, whereat said uncovered portions of said first layer are etched, such as to self-align said first layer with said overlaying portions of said second layer;

a third masking step, whereat a third layer of radiation-sensitive material is deposited, said layer is masked and soluble portions thereof are removed, said third layer of radiation-sensitive material protecting said further portion of second layer at said substrate;

a third etching step, whereat the overlaying portions of said second layer which have remained on said first layer are removed; and a final step, whereat said third radiation--sensitive material is removed.

3. The process according to claim 1, further comprising the following steps:

a third masking step, whereat a third layer of radiation-sensitive material is deposited, said layer is masked and soluble portions thereof are removed, said third layer of radiation-sensitive material protecting said further portion of second layer at said substrate;

a second etching step, whereat said uncovered portions of said first layer are etched, such as to self-align said first layer with the overlaying portions of said second layer;

a third etching step, whereat said overlaying portions of said second layer which have remained on said first layer are removed; and a final step, whereat said third radiation-sensitive material is removed.

4. A process for manufacturing a calibration structured particularly for the calibration of machines for measuring the degree of misalignment in integrated circuits in general, wherein the process comprises the following steps, performed on at least one calibration structure arranged in a preset position on a substrate:

a preparation step, whereat a first layer of a first material is selectively grown and deposited on a substrate and a first layer of radiation-sensitive material is deposited thereon;

a first masking step, whereat said first radiation-sensitive material is masked, a soluble part thereof is removed, said first layer is etched, uncovering a portion of said substrate, and the remainder of said first radiation-sensitive material is removed;

a first deposition step, whereat a second layer of a second material is deposited on said first layer and on said portion of said substrate, a second layer of radiation sensitive material being then deposited on said second layer;

a second masking step, whereat said second layer radiation-sensitive material is masked, the soluble part thereof is removed, leaving portions thereof above said second layer at said portion of said substrate and at said first layer, and uncovering portions of said second layer;

a first etching step, whereat said second layer is etched at its uncovered portions, said first etching leaving portions of said first layer uncovered;

a second etching step, whereat said uncovered portions of said first layer are etched, such as to self-align said first layer with overlaying portions of said second layer and with said portions of said second radiation-sensitive material, said portions of said second radiation-sensitive material being then removed;

a third masking step, whereat a third layer of radiation-sensitive material is deposited, said third layer is masked and soluble portions thereof are removed, said third layer of radiation-sensitive material protecting a portion of the second layer which has remained at said portion of said substrate;

a third etching step, whereat said overlaying portions of said second layer are removed; and a final step, whereat said third radiation-sensitive material is removed.

5. The process according to claim 2, wherein said first material of said first layer is selectively constituted by polysilicon, by dielectric for contacts, by a first metallization and by vias.

6. The process according to claim 2, wherein said second material of said second layer is selectively constituted by a layer of contacts, by a first metallization, by vias and by a second metallization.

7. The process according to claim 2, wherein said first material is selectively constituted by a layer of contacts, by a first metallization, by vias and by a second metallization.

8. The process according to claim 2, wherein said second material is selectively constituted by polysilicon, by dielectric for contact, by a first metallization and by vias.

9. A process for manufacturing a calibration structure, particularly for the calibration of machines for measuring misalignment in integrated circuits in general, wherein the process comprises the following steps, performed on at least one calibration structure arranged in a preset position on a substrate:

a preparation step, whereat a first layer of silicon oxide is grown on a substrate and a second layer of silicon nitride is deposited thereon;

a first masking step, whereat a first layer of radiation-sensitive material is deposited on said second layer and is subsequently masked, soluble portions thereof are removed, and said second layer and said first layer are etched, uncovering a portion of silicon substrate;

a first deposition step, whereat a third polysilicon layer is deposited;

a second masking step, whereat a second layer of radiation-sensitive material is deposited on said third layer, said second layer of radiation-sensitive material is masked and soluble portions thereof are removed uncovering portions of said third layer;

a first etching step, whereat the uncovered portions of said third layer are etched and removed, then uncovered portions of said second layer and of said first layer are etched and removed, then said second radiation-sensitive material is removed, such as to form from said third layer respective protective regions extending over preselected portions of said substrate;

a third masking step, whereat a third layer of radiation-sensitive material is deposited, said third radiation-sensitive material is masked, then soluble portions thereof are removed, while insoluble portions cover one of said protective regions, then the remaining protective regions are etched, uncovering said second layer, finally removing said third radiation-sensitive material;

a second deposition step, whereat a fourth layer of silicon oxide is deposited and a fifth silicon nitride layer is deposited thereon;

a fourth masking step, whereat a fourth layer of radiation-sensitive material is deposited on said fifth layer and is masked, subsequently removing the soluble portions thereof, then an etching is performed, removing parts of said fifth layer and of said fourth layer, uncovering portions of said second layer, and then said fourth radiation-sensitive material is removed;

a growth step, whereat thermal silicon oxide is grown externally to said fifth layer;

a final etching step, whereat the remaining portions of said fifth layer, of said fourth layer, of said second layer and of said first layer are removed, leaving said one of said protective regions formed from said third layer between said regions of said thermal silicon oxide, said one of said protective regions formed from said third layer being selectively aligned and misaligned by a known amount with respect to said regions of thermal silicon oxide.

10. A process for manufacturing a calibration structure, particularly for the calibration of machines for measuring the degree of misalignment in integrated circuits in general, wherein the process comprises the following steps, performed on at least one calibration structure arranged in a preset position on a substrate:

a preparation step, whereat a first silicon nitride layer is deposited on a substrate;

a first masking step, whereat a first layer of radiation-sensitive material is deposited on said first layer and is then masked, the soluble portions thereof are removed, defining regions of said first radiation-sensitive material overlaying said first layer, and then etching and removing portions of said first layer which have been left uncovered by the removal of said soluble portions, said regions of radiation-sensitive material being then removed, uncovering separated regions of said first layer;

a deposition step, whereat a second layer of silicon oxide is deposited on said separated regions of said first layer and on said substrate, a third layer of silicon nitride being then deposited on said second layer;

a second masking step, whereat a second layer of radiation-sensitive material is deposited on said third layer and is subsequently masked, subsequently removing soluble portions thereof and uncovering portions of said third layer, and said third layer and said second layer are then etched, uncovering lateral portions of said separated regions of said first layer;

a doping step, whereat doping with impurities of a second type is performed on the uncovered portions of the said substrate;

a first etching step, whereat said third layer and said lateral portions of said first layer are removed and then said second layer is removed, leaving uncovered said separated regions of said first layer between doped wells;

a third masking step, whereat a third layer of radiation-sensitive material is deposited on said separated regions of said first layer and on said substrate and is then masked, soluble portions thereof are then removed, leaving a protection of said third radiation-sensitive material on one of said separated regions;

a second etching step, whereat the remaining separated regions of said first layer which have been left uncovered by the removal of said third radiation-sensitive material are etched and removed; and a final step, whereat said remaining portion of said third radiation-sensitive material is removed, uncovering said one separated region of said first layer, said one selected region being selectively aligned and misaligned by a known amount, set during said first masking step, with respect to said doped wells.

11. Process according to claim 10, wherein said doping step is followed by a diffusion, in order to provide doped wells in said substrate and at the sides of said separated regions of said first layer.

12. Process according to claim 10, wherein a layer of silicon oxide is selectively deposited or grown in said preparation step between said substrate and said first silicon nitride layer.

13. Process according to claim 10, wherein said doping step comprises oxidations and etchings of said doped wells to lower their level.

14. Process according to claim 10, wherein said substrate is constituted by semiconductor material.

15. Process according to claim 13, wherein said substrate is selectively constituted by gallium arsenide and by silicon.

16. Process according to claim 10, wherein said radiation-sensitive materials are constituted by light-sensitive resin.

17. Process according to claim 1, wherein said preset position on said substrate comprises a plurality of preset areas, each of which has a misalignment the amount of which is known beforehand, said areas being suitable for calibrating alignment measurement machines.

18. Process according to claim 1, wherein said substrate has, after said first etching step, a plurality of calibration structures associate in groups of a finite number, each group of said calibration structures having a known misalignment with respect to a reference group with no misalignment.

* * * * *